United States Patent
Tailliet

(10) Patent No.: US 7,583,093 B2
(45) Date of Patent: Sep. 1, 2009

(54) ELECTRICAL TEST METHOD OF AN INTEGRATED CIRCUIT

(75) Inventor: Francois Tailliet, Fuveau (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 11/844,627

(22) Filed: Aug. 24, 2007

(65) Prior Publication Data

US 2008/0061810 A1 Mar. 13, 2008

(30) Foreign Application Priority Data

Aug. 25, 2006 (FR) .................................. 06 07504

(51) Int. Cl.
*G01R 27/08* (2006.01)
*G01R 31/26* (2006.01)
*G01R 31/00* (2006.01)
*G01R 31/02* (2006.01)
*H01L 23/58* (2006.01)

(52) U.S. Cl. ........................ 324/691; 324/537; 324/765; 324/770; 257/48

(58) Field of Classification Search .................. 324/537, 324/500, 766, 765; 257/48
See application file for complete search history.

(56) References Cited

U.S. PATENT DOCUMENTS

| 6,163,867 A | 12/2000 | Miller et al. ................. 714/736 |
| 6,449,748 B1 | 9/2002 | Jeng et al. ..................... 716/4 |
| 6,621,280 B1 * | 9/2003 | Ryan et al. ................... 324/719 |
| 2006/0038580 A1 * | 2/2006 | Hasegawa et al. ........... 324/770 |

FOREIGN PATENT DOCUMENTS

EP 0 288 804 11/1988

* cited by examiner

*Primary Examiner*—Ha Tran T Nguyen
*Assistant Examiner*—Karen M Kusumakar
(74) *Attorney, Agent, or Firm*—Lisa K. Jorgeonson; Eric M. Ringer; Seed IP Law Group PLLC

(57) ABSTRACT

A method for testing an integrated circuit is provided comprising steps of providing at least one first conductive path stretching along an element of the integrated circuit, applying a voltage at a point of the first conductive path, performing a first measurement of the voltage at a point of the first conductive path, and determining whether the integrated circuit is damaged according to the result of the first measurement. Application to the detection of damage due to the sawing or electrical testing of integrated circuits.

39 Claims, 4 Drawing Sheets

ELECTRICAL TEST METHOD OF AN INTEGRATED CIRCUIT

BACKGROUND

1. Technical Field

The present invention relates to integrated circuits, and in particular to the tests conducted at the end of manufacturing an integrated circuit.

2. Description of the Related Art

These tests are generally conducted using a test machine which applies probes to the contact pads of the integrated circuit. The probes are in the form of needles having a distal end diameter in the order of a few micrometers. The integrated circuits are tested one after the other by moving the semi-conductive wafer onto which the integrated circuits are collectively implanted under a head supporting the probes. When the wafer is motionless, the head is moved vertically to apply the probes to the contact pads of an integrated circuit, then removed from the wafer when the latter is moved. The probes should be positioned on the contact pads of the integrated circuits very accurately, otherwise the integrated circuit could be damaged.

FIGS. 1 and 2 represent in perspective a contact pad Pa of an integrated circuit IC to which a probe PB is applied. The contact pad comprises an electrically conductive upper layer 1. The integrated circuit IC is furthermore covered by a passivating layer 2 in an electrically insulating material, such as a polymer or a glass, also covering the edges of the contact pads.

The tip of the probe PB which is applied to the contact pad Pa is tilted in relation to an axis perpendicular to the contact pad Pa. The result is that when the probe is lowered to be in contact with the contact pad, it bends slightly when the downward movement of the probe continues once it is in contact with the contact pad. Sufficient contact pressure is thus obtained. However, as the proximal end of the probe is fixed, the tip of the probe brushes a certain surface area of the contact pad Pa during the downward movement of the head once the probe is in contact with the contact pad.

The result is that, as shown in FIG. 2, if the tip of the probe PB comes into contact with the contact pad Pa near an edge thereof, the tip of the probe will tend to partially tear the passivating layer 2 off. The same is true if the downward travel of the probe PB is excessive. The tip of the probe then brushes a larger surface area of the contact pad with excessive pressure, which could damage the actual contact pad by crushing or tearing off a portion of the conductive layer 1. This can result in short-circuits or current leakages due to a crushing of the layers of the integrated circuit located under the contact pad. In addition, during its travel over the surface of the contact pad, the tip of the probe can encounter the passivating layer 2 and could therefore partially tear it off.

Now the role of the passivating layer is to protect the integrated circuit against corrosion and contamination risks. If this layer is partially torn off, the service life and the reliability of the integrated circuit can be affected.

FIG. 3 is a cross-section of an edge of an integrated circuit IC. In FIG. 3, the integrated circuit IC is produced in a wafer in a semi-conductive material 4. The active face of the wafer 4 is covered by a first electrically insulating layer 3b. A layer of a first metallization plane is formed on the electrically insulating layer 3b. The layer of the first metallization plane comprises an electrically conductive path 1b formed around the integrated circuit IC. Vias 6 cross the insulating layer 3b to connect the conductive path 1b to doped zones formed in the semi-conductive material 4. Another electrically insulating layer 3a is formed on the first metallization plane. A layer of a second metallization plane is formed on the layer 3a. The layer of the second metallization plane comprises an electrically conductive path 1a formed around the integrated circuit IC, above the conductive path 1b. Vias 5 cross the insulating layer 3b to connect the conductive path 1a of the second metallization plane to the conductive path 1b of the first metallization plane. The set of conductive paths 1a, 1b forms an edge ground line Zc formed around the integrated circuit. The ground line Zc forms an electrical and mechanical shield ring of the integrated circuit.

The integrated circuit may comprise more metallization planes. In this case, the ground line comprises one conductive path in each metallization plane.

A passivating layer 2 covers the entire integrated circuit except for an edge zone 8 on the edge of the integrated circuit IC. The edge zone 8 corresponds to the sawing zone or scribe line of the wafer to individualize the integrated circuits. The centre of the scribe line is indicated by the arrow 7.

Once the integrated circuits implanted onto the wafer are tested, the wafer is cut along the scribe lines into chips each comprising an integrated circuit. The width of the scribe lines is typically in the order of 80 to 100 μm. The integrated circuits are insulated from the scribe lines by the ground line Zc that is used as a protection against the risks of contamination and corrosion resulting from faults in the passivating layer 2 following the sawing of the wafer (entry of impurities into the integrated circuit through the cut edge).

The scribe lines are generally provided wide enough so that a sufficient distance remains after cutting between the edge ground line and the cut edge of the chip. However, the sawing operation can cause cracks in the semi-conductive material or in the passivating layer 2. These cracks affect the integrity of the edge ground line which can then no longer play its protective role. Therefore, these faults also affect the service life and the reliability of the integrated circuit.

Any damage caused by the probes during the electrical testing or during the sawing operation can be detected by an optical inspection. If this inspection is performed by operators, it is not reliable and is relatively expensive. This detection can also be done automatically by a pattern recognition system.

Whether it is done manually or automatically, this inspection is not done systematically particularly due to the fact that it requires considerable processing time. The result is that damaged integrated circuits can be delivered to customers.

BRIEF SUMMARY

One embodiment of the invention detects faults in the edges of the contact pads and in the edge band of the integrated circuits.

This is achieved by providing a method for testing an integrated circuit, comprising steps of: providing at least one first conductive path, applying a voltage at a point of the first conductive path, performing a first voltage measurement at a point of the first conductive path, and determining whether the integrated circuit is damaged as a function of the result of the first measurement.

According to one embodiment of the present invention, the first conductive path is formed around an element of the integrated circuit.

According to one embodiment of the present invention, the method comprises steps of: providing a second conductive path formed along the element of the integrated circuit, performing a second voltage measurement at a point of the second conductive path, and determining whether the integrated circuit is damaged as a function of the result of the second measurement.

According to one embodiment of the present invention, the first and second conductive paths are at least partially superimposed.

According to one embodiment of the present invention, the first and second conductive paths are formed around the element of the integrated circuit.

According to one embodiment of the present invention, the method comprises steps of: applying a voltage to the element of the integrated circuit, performing a third voltage measurement at a point of the second conductive path, and determining whether the integrated circuit is damaged as a function of the result of the third measurement.

According to one embodiment of the present invention, the method comprises steps of: applying a voltage to the element of the integrated circuit, performing a fourth voltage measurement at a point of the first conductive path, and determining whether the integrated circuit is damaged as a function of the result of the fourth measurement.

According to one embodiment of the present invention, the element of the integrated circuit is a contact pad of the integrated circuit.

According to one embodiment of the present invention, the element of the integrated circuit is a ground line on an edge of the integrated circuit.

One embodiment of the present invention also relates to an integrated circuit comprising at least one first conductive path, and one test circuit configured for: applying a voltage at a point of the first conductive path, performing a first voltage measurement at a point of the first conductive path, and determining whether the integrated circuit is damaged as a function of the result of the first measurement.

According to one embodiment of the present invention, the first conductive path is formed around an element of the integrated circuit.

According to one embodiment of the present invention, the integrated circuit comprises a second conductive path, and a test circuit configured for performing a second voltage measurement at a point of the second conductive path, and determining whether the integrated circuit is damaged as a function of the result of the second measurement.

According to one embodiment of the present invention, the first and second conductive paths are at least partially superimposed.

According to one embodiment of the present invention, the first and second conductive paths are formed around the element of the integrated circuit.

According to one embodiment of the present invention, the integrated circuit comprises a test circuit configured for: applying a voltage to the element of the integrated circuit, performing a third voltage measurement at a point of the second conductive path, and determining whether the integrated circuit is damaged as a function of the result of the third measurement.

According to one embodiment of the present invention, the test circuit is configured for applying a voltage to the element of the integrated circuit, performing a fourth voltage measurement at a point of the first conductive path, and determining whether the integrated circuit is damaged as a function of the result of the fourth measurement. According to one embodiment of the present invention, the element of the integrated circuit is a contact pad of the integrated circuit.

According to one embodiment of the present invention, the element of the integrated circuit is a ground line on an edge of the integrated circuit.

According to one embodiment of the present invention, the conductive paths are formed in metallization planes in which the element is formed.

BRIEF DESCRIPTION OF THE SEVERAL VIEWS OF THE DRAWINGS

These and other features and advantages shall be presented in greater detail in the following description of an embodiment of the present invention, given in relation with, but not limited to the following figures, in which.

DETAILED DESCRIPTION

Figure 1:
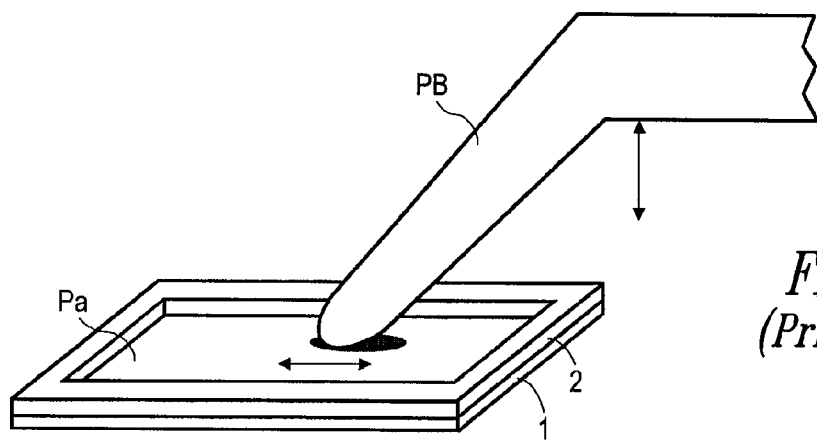
FIGS. 1 and 2 described above are perspective views of a contact pad of an integrated circuit, FIG. 3 already described is a cross-section of the edge of an integrated circuit.
Figure 2:
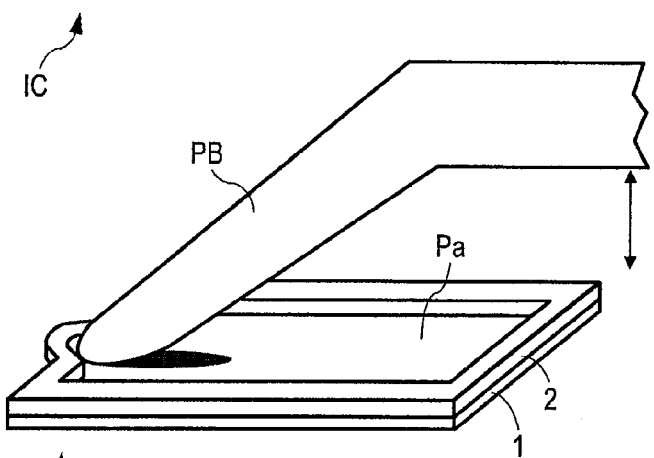
Figure 3:
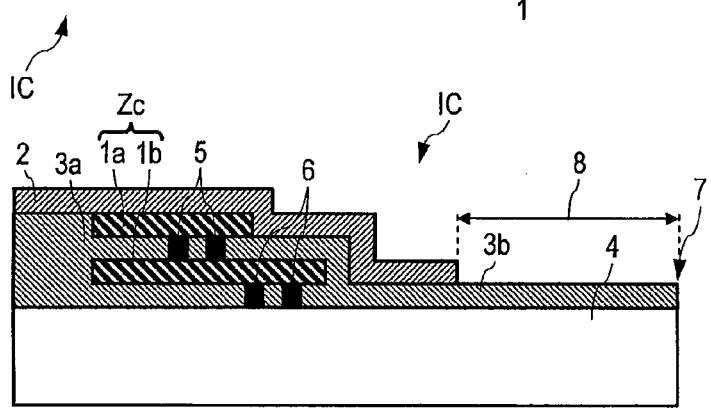
Figure 4:
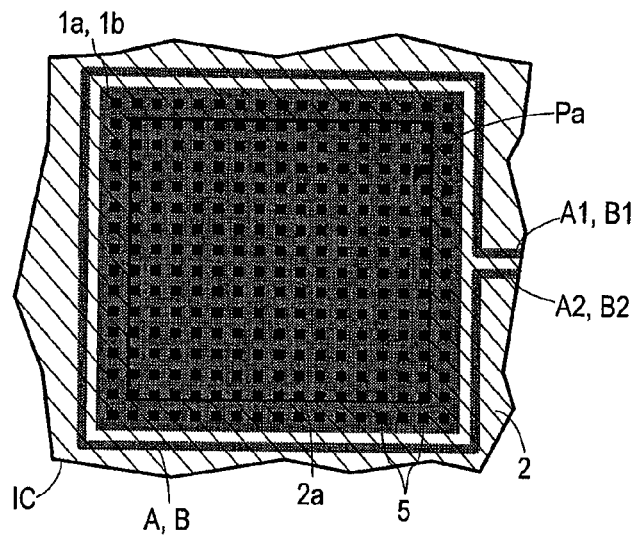
FIGS. 4 and 5 are top and cross-section views of a contact pad of an integrated circuit, according to one embodiment of the present invention.
Figure 5:
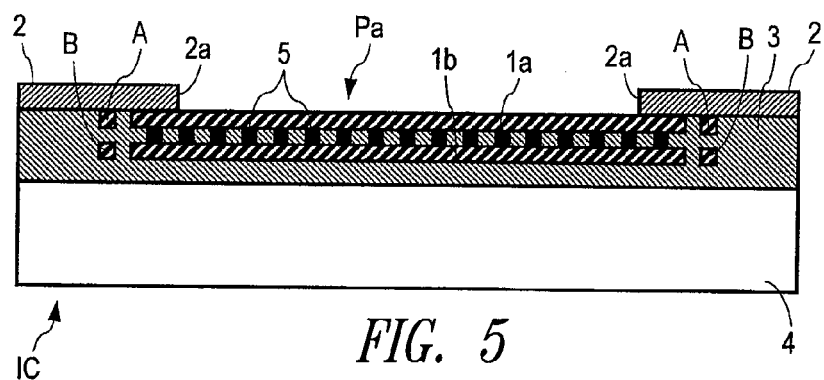

FIGS. 4 and 5 represent a contact pad Pa of an integrated circuit IC according to one embodiment of the present invention. The integrated circuit IC is produced in a wafer in a semi-conductive material 4 the active face of which is covered with an electrically insulating layer 3, for example in silica. The contact pad Pa is formed in the layer 3 by two superimposed metal layers 1a, 1b, belonging to two metallization planes, and linked to each other by vias 5 spread according to a matrix configuration in lines and in columns. The layer 3 is covered with a passivating layer 2 also covering the edge of the contact pad Pa.

According to one embodiment of the present invention, each metal layer 1a, 1b forming the contact pad Pa is surrounded by an electrically conductive path A, B. The ends of each conductive path A, B are connected to a detector circuit which will be described below.

If a probe PB has damaged the passivating layer 2 above the edge of the conductive pad Pa, it may also have cut the conductive path A or B. The probe may also have torn off a portion of the conductive pad which is then in contact with the conductive path A or B. It may also have crushed the insulating layer 3, putting the paths A and B in electrical contact.

A fault can therefore be detected by checking the electrical continuity between the ends of each of the conductors A and B, or the absence of electrical continuity between the contact pad Pa and one or other of the conductive paths A and B, or even the absence of electrical continuity between the conductive paths A and B.

Figure 6:
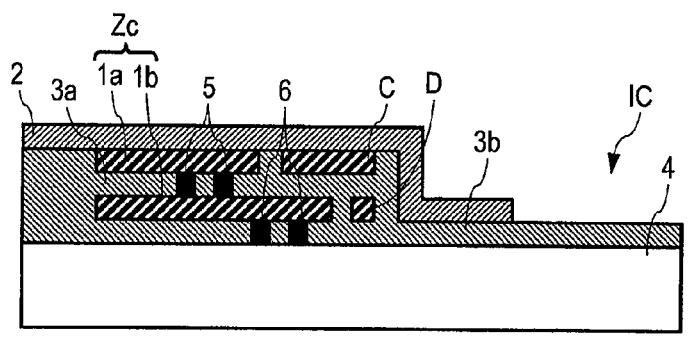
FIG. 6 is a cross-section of the edge of an integrated circuit according to one embodiment of the present invention.

FIG. 6 represents the edge of an integrated circuit IC. In FIG. 6, the integrated circuit IC is produced in a wafer in a semi-conductive material 4. The active face of the wafer 4 is covered with a first electrically insulating layer 3b. A layer of a first metallization plane is formed on the electrically insulating layer 3b. The layer of the first metallization plane comprises an electrically conductive path 1b formed around the integrated circuit IC. Vias 6 cross the insulating layer 3b to connect the conductive path 1b to doped zones formed in the semi-conductive material 4. Another electrically insulating layer 3a is formed on the first metallization plane. A layer of a second metallization plane is formed on the layer 3a. The layer of the second metallization plane comprises an electrically conductive path 1a formed around the integrated circuit IC, above the conductive path 1b. Vias 5 cross the insulating layer 3b to connect the zones 1a of the second metallization plane to the zones 1b of the first metallization plane. The set of zones 1a, 1b forms an edge ground line Zc formed around the integrated circuit.

The integrated circuit may comprise more metallization planes. In this case, the ground line comprises one conductive path in each metallization plane.

A passivating layer 2 covers the entire integrated circuit except for an edge zone 8 on the edge of the integrated circuit IC.

According to one embodiment of the present invention, each conductive path 1a, 1b is surrounded by a conductive path C, D formed in the same metallization plane. The conductive paths C, D are superimposed, the upper conductive path being covered by the passivating layer 2.

Advantageously, the upper conductive path C is larger than the conductive path D and covers both the latter and the edge of the conductive path 1b belonging to the same metallization plane as the conductive path D.

If the sawing of the integrated circuit has damaged the passivating layer 2, it may also have cut the conductive path C or D. The sawing of the integrated circuit can also have crushed the insulating layer 3a and thus have put the conductive paths C and D, or the conductive paths C and 1b in contact.

A fault resulting from the sawing can therefore be detected by checking the electrical continuity between the ends of each of the conductors C and D, or the absence of electrical continuity between the conductive paths C and D, or even the absence of electrical continuity between conductive zones of the metallization planes 1a, 1b and one or other of the conductive paths C and D.

Figure 7:
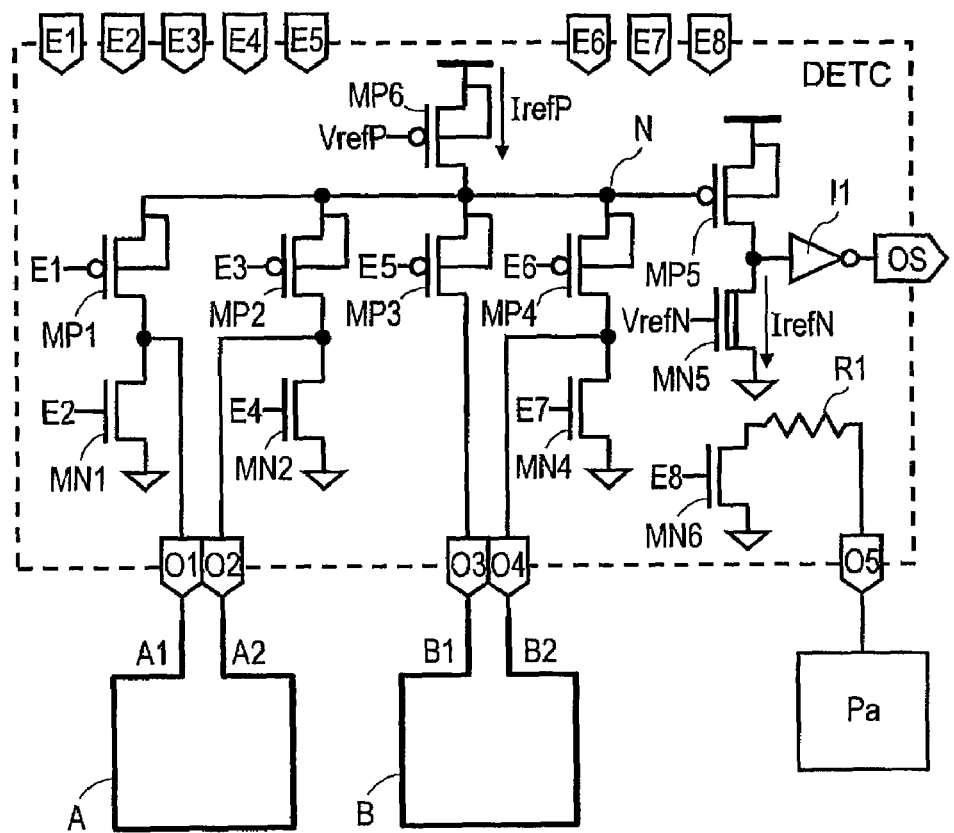
FIG. 7 represents a fault detector circuit according to one embodiment of the present invention, connected to a contact pad of the integrated circuit.
Figure 8:
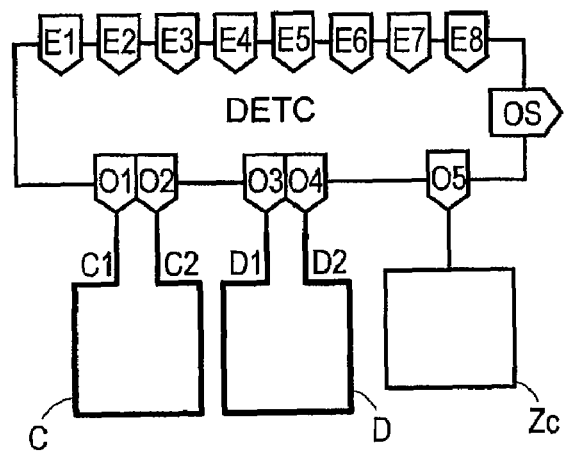
FIG. 8 represents the fault detector circuit connected to conductive paths on the edge of the integrated circuit.

FIGS. 7 and 8 represent a detector circuit DETC provided in the integrated circuit for a contact pad Pa or the edge ground line Zc. The detector circuit DETC comprises control signal inputs E1 to E8, outputs O1 to O5 provided to be connected to the ends of the conductive paths A, B or C, D and to a conductive zone 1 (contact pad Pa or edge ground line Zc of the integrated circuit) and a detection result signal output OS.

In FIG. 7, the outputs O1 and O2 are connected to the ends A1, A2 of the conductive path A, the outputs O3 and O4 are connected to the ends B1, B2 of the conductive path B, and the output O5 is connected to a contact pad Pa of the integrated circuit IC.

In FIG. 8, the outputs O1 and O2 are connected to the ends C1, C2 of the conductive path C, the outputs O3 and O4 are connected to the ends D1, D2 of the conductive path D, and the output O5 is connected to the edge ground line Zc of the integrated circuit IC.

In FIG. 7, the circuit DETC comprises a first stage comprising a P-channel MOS transistor MP1 and an N-channel MOS transistor MN1 the source of which is connected to the ground. The drain of the transistor MP1 is connected to the drain of the transistor MN1, and to the output O1 (intended to be connected to the end A1 or C1 of the conductive path A or C). The gate of the transistor MP1 is connected to the input E1. The gate of the transistor MN1 is connected to the input E2.

The circuit DETC comprises a second stage comprising a P-channel MOS transistor MP2 and an N-channel MOS transistor MN2 the source of which is connected to the ground. The drain of the transistor MP2 is connected to the drain of the transistor MN2, and to the output O2 (intended to be connected to the end A2 or C2 of the conductive path A or C). The gate of the transistor MP2 is connected to the input E3. The gate of the transistor MN2 is connected to the input E4.

The circuit DETC comprises a third stage comprising a P-channel MOS transistor MP3. The drain of the transistor MP3 is connected to the output O3 (intended to be connected to the end B1 or D1 of the conductive path B or D). The gate of the transistor MP3 is connected to the input E5.

The circuit DETC comprises a fourth stage comprising a P-channel MOS transistor MP4 and an N-channel MOS transistor MN4 the source of which is connected to the ground. The drain of the transistor MP4 is connected to the drain of the transistor MN4, and to the output O4 (intended to be connected to the end B2 or D2 of the conductive path B or D). The gate of the transistor MP4 is connected to the input E6. The gate of the transistor MN4 is connected to the input E7.

The circuit DETC comprises an N-channel MOS transistor MN6 the source of which is connected to the ground. The drain of the transistor MP4 is linked through a resistor R1 to the output O5 (intended to be connected to the contact pad Pa or the edge ground line Zc). The gate of the transistor MN6 is connected to the input E8 of the detector circuit.

The resistor R1 enables the transistor MN6 to be protected against electrostatic discharges (ESD), but has no active role in the operation of the circuit. Its value is in the order of one Kilo-Ohm. It should remain low enough so that the potential of the output O5 remains close to that of the ground, when the transistor MN6 is on and when a leakage is detected between the contact pad PA and the conductive paths A or B (R1×IrefP must remain low, for example R1=1 kOhm and Irefp=10 µA).

The circuit DETC comprises an output stage comprising a P-channel MOS transistor MP5, an N-channel MOS transistor MN5 the source of which is connected to the ground, and an inverter I1. The drain of the transistor MP5 is connected to the drain of the transistor MN5, and to the input of an inverter I1. The source of the transistor MP5 receives the supply voltage of the integrated circuit. The gate of the transistor MP5 is connected to a node N to which the sources of the transistors MP1, MP2, MP3 and MP4 are connected. The gate of the transistor MN5 is controlled by a reference voltage VrefN, so that the current IrefN passing through the transistor MN5 is constant. The output of the inverter I1 is connected to the output OS of the detector circuit.

The circuit DETC comprises a P-channel MOS transistor MP6 the source of which receives the supply voltage of the integrated circuit, and the drain of which is connected to the node N. The gate of the transistor MP6 is controlled by a reference voltage VrefP, so that the current IrefP passing through the transistor MP6 is constant.

The transistors controlled by the input signals E1-E8 are used as switches to connect the outputs O1-O4 to the ground or to the supply voltage source of the integrated circuit, and the output O5 to the ground, so as to perform electric conduction tests. The output stage switches substantially as soon as the potential of the node N is close to the conduction threshold voltage of the transistor MP5.

The following table summarizes for each test likely to be performed by the detector circuit the values of the inputs E1-E8 of the detector circuit and the value of the output signal OS if a fault is detected.

TABLE 1

| TEST | Type of Test | | E1 | E2 | E3 | E4 | E5 | E6 | E7 | E8 | OS |
|---|---|---|---|---|---|---|---|---|---|---|---|
| 0 | Open | O1-O3 | 1 | 1 | 1 | 0 | 0 | 1 | 0 | 0 | 0 |
| 1 | circuit | O2-O4 | 1 | 0 | 1 | 1 | 1 | 0 | 0 | 0 | 0 |
| 2 | | O1-O5 | 0 | 0 | 1 | 0 | 1 | 1 | 0 | 1 | 0 |
| 3 | | O2-O5 | 1 | 0 | 0 | 0 | 1 | 1 | 0 | 1 | 0 |
| 4 | | O3-O5 | 1 | 0 | 1 | 0 | 0 | 1 | 0 | 1 | 0 |
| 5 | | O4-O5 | 1 | 0 | 1 | 0 | 1 | 0 | 0 | 1 | 0 |
| 6 | Electrical | O1-O2 | 0 | 0 | 1 | 1 | 1 | 1 | 0 | 0 | 1 |
| 7 | continuity | O3-O4 | 1 | 0 | 1 | 0 | 0 | 1 | 1 | 1 | 1 |

Tests 0 and 1: absence of electrical continuity between two superimposed conductive paths A and B (or C and D)

In the tests 0 and 1, the output O5 is put to a floating potential (transistor MN6 off). The contact pad Pa (or the edge ground line Zc) is therefore put to a floating potential.

In the test 0, the transistor MP1 of the first stage is controlled off, and the transistor MN1 of this stage is controlled on. The result is that the output O1 is grounded. In the second stage, the transistors MP2 and MN2 are controlled off. The output O2 is therefore at a floating potential. In the third stage, the transistor MP3 is controlled on. The output O3 is therefore on 1 (at the supply voltage). In the fourth stage, the transistors MP4 and MN4 are controlled off. The result is that the output O4 is put to a floating potential.

If there is a short-circuit between the outputs O1 and O3, i.e., between the ends A1 and B1 (or C1 and D1) of the conductive paths A and B (or C and D), the output O3 is grounded instead of being on 1, and therefore the output OS of the detector circuit is on 0. In the opposite case, the output OS is on 1.

In test 1, the transistors MP1 and MN1 of the first stage are controlled off. The result is that the output O1 is put to a floating potential. In the second stage, the transistor MP2 is controlled off, and the transistor MN2 is controlled on. The output O2 is therefore grounded. In the third stage, the transistor MP3 is controlled off. The output O3 is therefore put to a floating potential. In the fourth stage, the transistor MP4 is controlled on and the transistor MN4 is controlled off. The result is that the output O4 is set to 1.

If there is a short-circuit between the outputs O2 and O4, i.e., between the ends A2 and B2 (or C2 and D2) of the conductive paths A and B (or C and D), the output O4 is grounded instead of being on 1, and therefore the output OS of the detector circuit is on 0. In the opposite case, the output OS is on 1.

Tests 2 to 5: absence of electrical continuity between a conductive path A and B (or C and D) and the contact pad Pa (or the edge ground line Zc)

In tests 2 to 5, the output O5 is grounded (transistor MN6 on). The contact pad Pa (or the edge ground line Zc) is therefore grounded.

In test 2, the transistor MP1 of the first stage is controlled on, and the transistor MN1 of this stage is controlled off. The result is that the output O1 is set to 1. In the second stage, the transistors MP2 and MN2 are controlled off. The output O2 is therefore at a floating potential. In the third stage, the transistor MP3 is controlled off. The output O3 is therefore at a floating potential. In the fourth stage, the transistors MP4 and MN4 are controlled off. The result is that the output O4 is put to a floating potential.

If there is a short-circuit between the outputs O1 and O5, i.e., between the end A1 (or C1) of the conductive paths A (or C) and the contact pad Pa (or the edge ground line Zc), the output O1 is grounded instead of being on 1, and therefore the output OS of the detector circuit is on 0. In the opposite case, the output OS is on 1.

In test 3, the transistors MP1 and MN1 of the first stage are controlled off. The result is that the output O1 is put to a floating potential. In the second stage, the transistor MP2 is controlled on, and the transistor MN2 is controlled off. The output O2 is therefore set to 1. In the third stage, the transistor MP3 is controlled off. The output O3 is therefore put to a floating potential. In the fourth stage, the transistors MP4 and MN4 are controlled off. The result is that the output O4 is put to a floating potential.

If there is a short-circuit between the outputs O2 and O5, i.e., between the end A2 (or C2) of the conductive paths A (or C) and the contact pad Pa (or the edge ground line Zc), the output O2 is grounded instead of being on 1, and therefore the output OS of the detector circuit is on 0. In the opposite case, the output OS is on 1.

In test 4, the transistors MP1 and MN1 of the first stage are controlled off. The result is that the output O1 is put to a floating potential. In the second stage, the transistors MP2 and MN2 are controlled off. The output O2 is therefore at a floating potential. In the third stage, the transistor MP3 is controlled on. The output O3 is therefore set to 1. In the fourth stage, the transistors MP4 and MN4 are controlled off. The result is that the output O4 is put to a floating potential.

If there is a short-circuit between the outputs O3 and O5, i.e., between the end B1 (or D1) of the conductive paths B (or D) and the contact pad Pa or the edge ground line Zc, the output O3 is grounded instead of being on 1, and therefore the output OS of the detector circuit is on 0. In the opposite case, the output OS is on 1.

In test 5, the transistors MP1 and MN1 of the first stage are controlled off. The result is that the output O1 is put to a floating potential. In the second stage, the transistors MP2 and MN2 are controlled off. The output O2 is therefore at a floating potential. In the third stage, the transistor MP3 is controlled off. The output O3 is therefore at a floating potential. In the fourth stage, the transistor MP4 is controlled on, and the transistor MN4 is controlled off. The result is that the output O4 is set to 1.

If there is a short-circuit between the outputs O4 and O5, i.e., between the end B2 (or D2) of the conductive paths B (or D) and the contact pad Pa or the edge ground line Zc, the output O4 is grounded instead of being on 1, and therefore the output OS of the detector circuit is on 0. In the opposite case, the output OS is on 1.

Tests 6 and 7: electrical continuity between the ends of the conductive path A or B (or C or D)

In tests 6 and 7, the output O5 is put to a floating potential (transistor MN6 off). The contact pad Pa (or the edge ground line Zc) is therefore put to a floating potential.

In test 6, the transistor MP1 of the first stage is controlled on, and the transistor MN1 is controlled off. The result is that the output O1 is set to 1. In the second stage, the transistor MP2 is controlled off, and the transistor MN2 is controlled on. The output O2 is therefore grounded. In the third stage, the transistor MP3 is controlled off. The output O3 is therefore at a floating potential. In the fourth stage, the transistors MP4 and MN4 are controlled off. The result is that the output O4 is put to a floating potential.

If there is electrical continuity between the outputs O1 and O2, i.e., between the ends A1 and A2 (or C1 and C2) of the conductive path A (or C), the output O1 is grounded instead of being on 1, and therefore the output OS of the detector circuit is on 0. In the opposite case, the output OS is on 1.

In test 7, the transistors MP1 and MN1 of the first stage are controlled off. The output O1 is therefore put to a floating potential. In the second stage, the transistors MP2 and MN2 are controlled off. The output O2 is therefore at a floating potential. In the third stage, the transistor MP3 is controlled on. The output O3 is therefore set to 1. In the fourth stage, the transistor MP4 is controlled off, and the transistor MN4 is controlled on. The result is that the output O4 is grounded.

If there is electrical continuity between the outputs O3 and O4, i.e., between the ends B1 and B2 (or D1 and D2) of the conductive path B (or D), the output O3 is grounded instead of being on 1, and therefore the output OS of the detector circuit is on 0. In the opposite case, the output OS is on 1.

Figure 9:
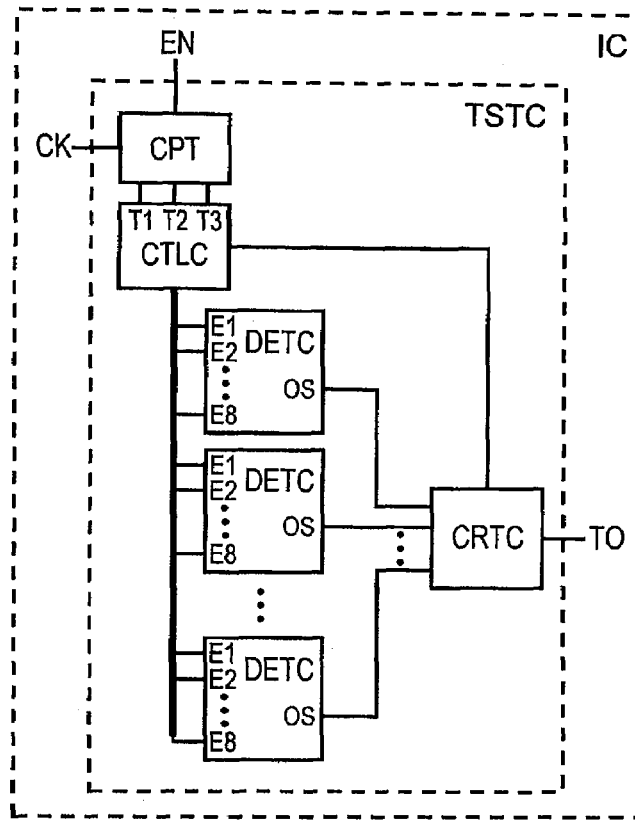
FIG. 9 represents a test circuit of the integrated circuit, according to one embodiment of the present invention.

It will be understood that the tests are not necessarily performed in the order specified in the table. Thus, for example if tests 6 and 7 are conducted first, and if the conductive paths A and B (or C and D) thus tested have no cut-off, the tests 0 and 1 are equivalent. FIG. 9 represents a test circuit TSTC of the integrated circuit IC. The test circuit TSTC comprises a plurality of detector circuits DETC, such as the one described with reference to FIG. 7, with one detector circuit for each test pad and for the edge of the integrated circuit. The inputs of the circuits DETC are connected to a control circuit CTLC designed to generate the signals E1-E8 in accordance with one of tests 0 to 7 listed in table 1, according to control signals T1, T2, T3 enabling one of tests 0 to 7 to be selected. The respective outputs of each of the detector circuits DETC are connected to a circuit for consolidating the results of the tests CRTC which supplies a test result signal TO on 0 or on 1 depending on whether one of the circuits DETC has detected a fault during one of tests 0 to 7. The signal TO is for example supplied on a test terminal of the integrated circuit.

The signals T1, T2, T3 are supplied by a counter CPT from 0 to 7, paced by a clock signal CK of the integrated circuit IC. The state machine is triggered by an activation signal EN supplied for example from the external environment of the integrated circuit by a test terminal.

Alternatively the signals T1, T2, T3 are supplied by a test device external to the integrated circuit IC through test terminals. When a test has failed, this solution offers the advantage of determining which one failed.

When the contact pads are output or input/output connections, an additional circuit can be provided enabling the contact pad to be put in high impedance during the performance of the tests.

Figure 10:
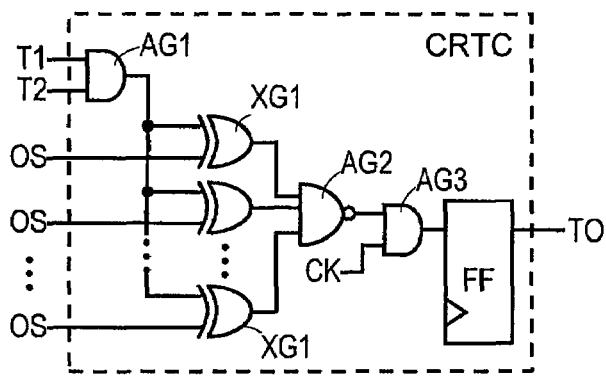
FIG. 10 is a wiring diagram of one circuit of the test circuit represented in FIG. 9.

FIG. 10 represents an example of the circuit for consolidating the results of the tests CRTC. The circuit CRTC comprises an AND-type logic gate AG1 receiving at input the signals T1, T2 supplied by the counter CPT. The circuit CRTC comprises exclusive OR-type logic gates XG1 receiving at input the output signal of the gate AG1 and an output signal OS of the detector circuits DETC. The output of each of the gates XG1 is connected to an input of an inverted AND-type logic gate AG2. The output of the gate AG2 is connected to the input of an AND-type logic gate AG3 another input of which receives the clock signal CK. The output of the gate AG3 is connected to the input of an RS-type flip-flop FF the output of which supplies the test result signal TO.

The gate AG1 supplies a signal on 1 when the test number is equal to 6 or 7. The gates XG1 enable the output signals OS of the circuits DETC to be inverted for tests 6 and 7. The gate AG2 supplies a signal on 1 if one of the tests performed by the detector circuits failed. The gate AG3 enables the output signal of the gate AG2 to be conditioned according to the clock signal CK, assuming that the signals T1, T2 and T3 are stable while the signal CK is on 1. Indeed, during the state changes of the counter, logic variables can create transient prohibited states on the inputs E1-E8, and therefore cause a false error detection. The flip-flop FF enables the change to 1 of the output signal of the gate AG2 to be stored.

It will be understood by those skilled in the art that various alternative embodiments and applications of the present invention are possible. In particular, the present invention is not limited to test conductive paths formed around the contact pads of the integrated circuit. A conductive path formed along only one, two or three sides of the conductive pad can be considered, particularly if the integrated circuits are always presented facing the test head with the same orientation.

It is not essential either to provide a test conductive path for each of the metallization planes constituting the contact pad or the edge ground line. A single conductive path can be provided.

It is not essential either to connect the detector circuit to the ends of the conductive paths.

Certain tests indicated in table 1 can be omitted, as the table gives a list of several possible tests, given the test conductive paths provided.

The present invention does not apply solely to testing integrated circuits. Thus it can also apply for example to the detection of corrosion. For this purpose, the detector circuit DETC is connected to a metal strip sensitive to corrosion, formed on the integrated circuit, for example visible through a window.

One embodiment of the invention can also be applied to produce a chip that is disposable after deactivation. For this purpose, the conductive path connected to the detector circuit may comprise a metal strip capable of being accessible using a tool, the output signal of the detector circuit being used to deactivate the integrated circuit. In both of these examples of application, the detector circuit DETC is then active throughout the service life of the integrated circuit.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method for testing an integrated circuit, the method comprising:
   providing a first conductive path in the integrated circuit, the first conductive path being adjacent to and not electrically connected to an element of the integrated circuit being tested;
   applying a voltage at a first point of the first conductive path using a test circuit included in the integrated circuit;
   performing a first voltage measurement at a second point of the first conductive path using the test circuit;
   applying a voltage to the element of the integrated circuit;
   performing a second voltage measurement at the second point of the first conductive path; and determining, based on at least one of the first voltage measurement and using the test circuit, and the second voltage measurement, whether the element of the integrated circuit is damaged.

2. The method according to claim 1, wherein the first conductive path is formed around the element of the integrated circuit.

3. The method according to claim 2 comprising:
providing a second conductive path adjacent to and not electrically connected to the element;
performing a third voltage measurement at a first point of the second conductive path; and
determining, based on the third voltage measurement, whether the integrated circuit is damaged.

4. The method according to claim 3, wherein the first and second conductive paths are at least partially superimposed.

5. The method according to claim 3, wherein the first and second conductive paths are formed around the element of the integrated circuit.

6. The method according to claim 3 comprising:
performing a fourth voltage measurement at a second point of the second conductive path; and
determining, based on the fourth voltage measurement, whether the integrated circuit is damaged.

7. The method according to claim 1, wherein the element of the integrated circuit is a contact pad of the integrated circuit.

8. The method according to claim 1, wherein the element of the integrated circuit is a ground line on an edge of the integrated circuit.

9. An integrated circuit comprising: an element being tested;
a first conductive path adjacent to and not electrically connected to the element being tested; and
a test circuit configured for:
applying a voltage at a first point of the first conductive path;
performing a first voltage measurement at a second point of the first conductive path;
applying a voltage to the element of the integrated circuit;
performing a second voltage measurement on the second conductive path; and
determining, based on at least one of the first voltage measurement and the second voltage measurement, whether the element of the integrated circuit is damaged.

10. The integrated circuit according to claim 9, wherein the first conductive path stretches around the element of the integrated circuit.

11. The integrated circuit according to claim 10 wherein the integrated circuit comprises a second conductive path adjacent to and not electrically connected to the element and the test circuit is configured for:
performing a third voltage measurement at a second point of the second conductive path; and
determining, based on the third voltage measurement, whether the integrated circuit is damaged.

12. The integrated circuit according to claim 11, wherein the first and second conductive paths are at least partially superimposed.

13. The integrated circuit according to claim 11, wherein the first and second conductive paths are formed around the element of the integrated circuit.

14. The integrated circuit according to claim 11, wherein the test circuit is configured for:
performing a fourth voltage measurement at the second point of the second conductive path; and
determining, based on the fourth voltage measurement, whether the integrated circuit is damaged.

15. The integrated circuit according to claim 9, wherein the element of the integrated circuit is a contact pad of the integrated circuit.

16. The integrated circuit according to claim 9, wherein the element of the integrated circuit is a ground line on an edge of the integrated circuit.

17. The integrated circuit according to claim 9, wherein the conductive paths are formed in metallization planes in which the element is formed.

18. An integrated circuit comprising:
a test element;
a first test conductor adjacent to and not electrically connected to the test element;
a second test conductor situated under the first test conductor and not electrically connected to the test element; and
test means, connected to the first test conductor, for determining whether the test element is damaged by measuring an electrical quantity of the first test conductor, wherein the test means are configured to perform a plurality of damage tests by sequentially applying a plurality of test voltages to a plurality of test contacts of the first and second test conductors.

19. The integrated circuit of claim 18 comprising a consolidation circuit for consolidating results of the plurality of damage tests.

20. The integrated circuit of claim 18 wherein the test element is a passivation layer.

21. The integrated circuit of claim 18 wherein the test element is a contact pad of the integrated circuit.

22. The integrated circuit of claim 19 wherein the test means comprise a plurality of detector circuits each configured to perform a plurality of damage tests.

23. A method for testing an integrated circuit, the method comprising:
providing a first conductive path in the integrated circuit, the first conductive path being adjacent to and not electrically connected to an element of the integrated circuit being tested;
providing a second conductive path adjacent to and not electrically connected to the element;
applying a voltage at a first point of the first conductive path using a test circuit included in the integrated circuit;
applying a voltage to the element of the integrated circuit;
performing a first voltage measurement at a second point of the first conductive path using the test circuit;
performing a second voltage measurement at a first point of the second conductive path; and
determining, based at least on one of the first voltage measurement and using the test circuit, and the second voltage, whether the element of the integrated circuit is damaged.

24. The method according to claim 23, wherein the first conductive path is formed around the element of the integrated circuit.

25. The method according to claim 24 comprising:
performing a third voltage measurement at a second point of the second conductive path; and
determining, based on the third voltage measurement, whether the integrated circuit is damaged.

26. The method according to claim 25, wherein the first and second conductive paths are at least partially superimposed.

27. The method according to claim 25, wherein the first and second conductive paths are formed around the element of the integrated circuit.

28. The method according to claim 23 comprising:
applying a voltage to the element of the integrated circuit;
performing a third voltage measurement at a point of the first conductive path; and
determining, based on the third voltage measurement, whether the integrated circuit is damaged.

29. The method according to claim 23, wherein the element of the integrated circuit is a contact pad of the integrated circuit.

30. The method according to claim 23, wherein the element of the integrated circuit is a ground line on an edge of the integrated circuit.

31. An integrated circuit comprising:
an element being tested;
a first conductive path adjacent to and not electrically connected to the element being tested;
a second conductive path adjacent to and not electrically connected to the element; and
a test circuit configured for:
  applying a voltage at a first point of the first conductive path;
  applying a voltage to the element of the integrated circuit;
  performing a first voltage measurement at a second point of the first conductive path;
  performing a second voltage measurement on the second conductive path; and
  determining, based on at least one of on the first voltage measurement and the second voltage measurement, whether the element of the integrated circuit is damaged.

32. The integrated circuit according to claim 31, wherein the first conductive path stretches around the element of the integrated circuit.

33. The integrated circuit according to claim 32 wherein the test circuit is configured for:
  performing a third voltage measurement at a first point of the second conductive path; and
  determining, based on the third voltage measurement, whether the integrated circuit is damaged.

34. The integrated circuit according to claim 33, wherein the first and second conductive paths are at least partially superimposed.

35. The integrated circuit according to claim 33, wherein the first and second conductive paths are formed around the element of the integrated circuit.

36. The integrated circuit according to claim 31, wherein the test circuit is configured for:
  applying a voltage to the element of the integrated circuit;
  performing a third voltage measurement on the first conductive path; and
  determining, based on the third voltage measurement, whether the integrated circuit is damaged.

37. The integrated circuit according to claim 31, wherein the element of the integrated circuit is a contact pad of the integrated circuit.

38. The integrated circuit according to claim 31, wherein the element of the integrated circuit is a ground line on an edge of the integrated circuit.

39. The integrated circuit according to claim 31, wherein the conductive paths are formed in metallization planes in which the element is formed.

* * * * *